(12) United States Patent
Bell (10) Patent No.: US 7,581,668 B2
(45) Date of Patent: Sep. 1, 2009

(54) METHOD AND DEVICE FOR REFLOW SOLDERING WITH VOLUME FLOW CONTROL

(75) Inventor: Hans Bell, Berlin (DE)

(73) Assignee: Rehm Thermal Systems GmbH, Blaubeuren-Seissen (DE)

( * ) Notice: Subject to any disclaimer, the term of this patent is extended or adjusted under 35 U.S.C. 154(b) by 44 days.

(21) Appl. No.: 10/577,680

(22) PCT Filed: Oct. 29, 2004

(86) PCT No.: PCT/EP2004/012262

§ 371 (c)(1),
(2), (4) Date: Sep. 24, 2007

(87) PCT Pub. No.: WO2005/043758

PCT Pub. Date: May 12, 2005

(65) Prior Publication Data

US 2008/0061116 A1    Mar. 13, 2008

(30) Foreign Application Priority Data

Oct. 30, 2003   (DE)   ................. 103 50 699

(51) Int. Cl.
*B23K 1/00*   (2006.01)
*B23K 1/012*  (2006.01)

(52) U.S. Cl. .................. 228/180.21; 228/230; 219/388; 219/681

(58) Field of Classification Search ............ 228/180.21, 228/230; 219/388, 681
See application file for complete search history.

(56) References Cited

U.S. PATENT DOCUMENTS

| 4,771,929 A | | 9/1988 | Bahr et al. |
| 5,553,768 A | | 9/1996 | Lasto et al. |
| 5,560,531 A | | 10/1996 | Ruszowski |
| 5,573,688 A | * | 11/1996 | Chanasyk et al. ........... 219/388 |
| 6,005,224 A | * | 12/1999 | Wesseling et al. ........... 219/388 |
| 6,313,524 B1 | | 11/2001 | Pueschner et al. |

(Continued)

FOREIGN PATENT DOCUMENTS

CN          88100726       9/1988

(Continued)

OTHER PUBLICATIONS

International Search Report for International Application No. PCT/EP2004/012262 mailed on Jun. 28, 2006.

(Continued)

*Primary Examiner*—Jessica L Ward
*Assistant Examiner*—Erin B Saad
(74) *Attorney, Agent, or Firm*—Sterne, Kessler, Goldstein & Fox P.L.L.C.

(57) ABSTRACT

According to one aspect of the invention it is possible to rapidly heat a soldering item by reducing an initially larger volume flow at a constant or increasing temperature, effectively preventing small components from overheating. By using the volume flow of a convection heater to control effective heat transmission occurring on said soldering item, it is also possible to adapt the soldering process in an extremely flexible manner to special process requirements by virtue of the fact that adjustment of a modified volume flow can be controlled in a very quick and precise manner.

9 Claims, 3 Drawing Sheets

U.S. PATENT DOCUMENTS

| | | |
|---|---|---|
| 6,642,485 B2 | 11/2003 | Goenka et al. |
| 6,726,087 B2 | 4/2004 | Diehm et al. |
| 6,936,793 B1 * | 8/2005 | Shiloh et al. ............... 219/400 |

FOREIGN PATENT DOCUMENTS

| | | |
|---|---|---|
| DE | 19741192 | 5/1998 |
| DE | 19826417 | 12/1999 |
| DE | 101 33 217 A1 | 1/2003 |
| DE | 102 56 250 A1 | 8/2003 |
| EP | 0 279 604 A2 | 8/1988 |
| EP | 1 133 219 A1 | 9/2001 |
| RU | 2118585 | 9/1998 |
| RU | 2165660 | 4/2001 |

OTHER PUBLICATIONS

English Abstract for Japanese Patent Publication No. JP 2001 160675, 1 page.

Office Action for German Patent Application No. 10350699.3, dated Jun. 22, 2004, 2 pages.

* cited by examiner

METHOD AND DEVICE FOR REFLOW SOLDERING WITH VOLUME FLOW CONTROL

FIELD OF THE INVENTION

The invention relates to a method and device for reflow soldering, wherein items for soldering, assembled with components, are subjected to specific soldering, in that a solder paste, which is in contact with the components at specific points, is after preheating liquefied in a soldering zone to thus establish the desired solder contact.

BACKGROUND

During the industrial large-scale production of modules with electronic components, normally a large number of temperature sensitive components must be soldered to corresponding contact pads on a circuit board. For this purpose the electronic components comprise appropriate solder surfaces, which for conventional components are provided as wire connections or contact pins, or which are provided in the form of metal surfaces at appropriate points, which is the case for components for surface mounting (SMD components). With the on-going miniaturisation of modules the individual components are becoming continually smaller, wherein the type of the component and its purpose in part imply a certain minimum size. For example, resistors, diodes and small-signal transistors are manufactured in extremely small cases, whereas other components, such as inductors, capacitors or power transistors are accommodated in significantly larger cases. Since increasingly, all types of devices are being electronically controlled, normally a large number of components with small-signal properties as well as a range of components with higher power or larger volume requirement is necessary. An appropriately designed module therefore normally comprises components with very different sizes and shapes and consequently with very different thermal behaviour.

For a perfect mechanical and electrical joint between a component or its metal connection surface, and a corresponding contact pad on the board, liquefaction of the solder paste for no longer than approximately 60 seconds is required, wherein however the individual components may be subjected to a specified temperature depending on the component specification for only a very limited time. The liquidus temperature of typical solder pastes lies in the region of 183 to 227° C., corresponding to a temperature which for most of the components used is not critical for a range of many minutes. The subjection of a module to a temperature just above the liquidus temperature would therefore avoid the risk of overheating small components which quickly become hot, but would lead to a longer soldering phase, because the metal surfaces on the small components would have already exceeded the liquidus temperature, whereas the metal surfaces on large components would not yet allow any liquefaction of the solder paste. The very long soldering for the small components arising in this case generally leads however to a defective soldering result and so this technique appears to be less attractive. A slow and therefore uniform heating of all components up to just below the liquidus temperature of the solder paste could significantly reduce the problem mentioned above, but in practice there are problems because certain activators in the solder paste lose their function before the actual solder process and in addition, an unwanted oxidation of the metal surfaces to be soldered occurs, wherein the wetting properties of the solder contacts with liquid solder is impaired.

In many known devices the item to be soldered is heated in a preheating zone to a temperature in the range from 150 to 160° C. (when using solders containing lead) or 160 to 200° C. (when using lead-free solders), wherein the heating occurs such that essentially a temperature equilibrium can form in the item to be soldered. Following that, the item to be soldered is brought into a soldering zone in which it is subjected to a significantly higher temperature, so that initially the components are brought to a temperature above the liquidus temperature of the solder paste and the solder process occurs during the liquefaction of the solder paste. Since the heating and the solder process are to take place in a time frame of a maximum of 50 to 60 seconds, generally high temperatures of 240 to 300° C. are used in the soldering zone. As previously mentioned, generally small components assume a high temperature more quickly than correspondingly inert and large components, so that with these high temperatures prevailing in the soldering zone the danger of overheating small components arises, which can result in malfunctions or the premature failure of the components and therefore of the complete module. Consequently, attempts are being made on one hand to facilitate rapid heating of the components above the liquidus temperature, wherein on the other hand however the risk of overheating smaller components is reduced. In this connection the German patent specification DE 197 41 192 describes a reflow soldering method for soldering an item to be soldered in a transit oven, wherein the item to be soldered is brought to a temperature below the melting temperature of the solder in a preheating zone by means of preheating devices and is then soldered in a soldering zone by means of heating equipment and is then cooled in a cooling zone to a temperature below the melt temperature. The soldering method described in DE 197 41 192 is characterised in that the item to be soldered is first brought into a first region of the soldering zone in which it is subjected by means of a first convector heater to a temperature which is significantly above the melt temperature of the solder. Then the item to be soldered is brought into a following second section of the soldering zone in which the item to be soldered is subjected by means of a second convector heater to a lower temperature which however still lies above the melting temperature of the solder. Here, in this described reflow soldering method the initially high first temperature is to enable heating in particular of the smaller components above the liquidus temperature, wherein in the following step with lower temperature overheating of the smaller components is to be avoided, whereas the larger components continue to increase their temperature up to the required liquidus temperature.

Although the previously mentioned method can lead to a more balanced run of temperature when soldering large and small components, the exact adjustment of the first and second temperatures and the corresponding dwell time in the first section with the high temperature must be matched to the respective module, because otherwise there is the risk that small components will be overheated in the first high temperature stage. When processing a large number of different modules, the extent to which the machine can be loaded is restricted, because the temperature adjustment for the various modules must be readjusted or there is the risk of an increased failure rate due to the overheating of small components if the same setting is used for different modules.

SUMMARY

It is therefore the object of the invention to provide a method and a device for the reflow soldering of items to be soldered, wherein there is a high degree of flexibility in the processing of different modules and nevertheless the risk of overheating small components during the soldering process is slight.

According to the invention, following one aspect of the invention, this object is solved by a method of soldering an item to be soldered in a transit oven, wherein the method comprises: heating the item to be soldered in a preheating zone by means of a preheating device to a temperature which lies below the melting temperature of a solder which is in contact with the item to be soldered. Furthermore, the item to be soldered is subjected to a volume flow of heated gas with a specified temperature which lies above the melting temperature of the solder. Then the volume flow is reduced, wherein the specified temperature is retained or increased. Finally, the item to be soldered is cooled to below the melting temperature in a third zone.

According to the invention, the control of the effective temperature of the components of an item to be soldered takes place partially by varying the volume flow of the heated gas such that a rapid and more sensitive adjustment of the current temperature profile of the module is possible in comparison to a relatively sluggish control of the temperature, which is generally controlled by subdividing a soldering zone into certain sections with constant temperature in discrete steps. In contrast, the solution according to the invention facilitates the implementation of an effective temperature profile on the module through the closed-loop control of the volume flow and optionally of the temperature within relative short time periods and, if required, also within a single soldering zone section, wherein then overheating of small components can be prevented due to the following reduction of the volume flow in an efficient manner and further heating of the larger components can be realised. For example, a very high volume flow at a specified temperature can be established at the start in the soldering zone, wherein the solder paste which is not yet liquefied ensures the fixation of the components on the circuit board due to its adhesive force and the high volume flow facilitates the rapid heating of small and large components. Thus, the specified temperature of the volume flow can for example be selected such that a certain critical temperature for the components cannot be exceeded. Following this, the volume flow is reduced, for example, before the start of the liquefaction of the solder paste, so that generally the exposure of all components to the temperature is reduced and at the same time the solder paste liquefying on small components is hardly or not affected mechanically by the volume flow which is now reduced. For example, the time of liquefaction of the solder paste on a small component can be optically monitored and a reduction of the volume flow can then be carried out directly continuously or step by step. Thus, the reduction of the volume flow by an appropriate control of fan elements in the same section of the soldering zone can be carried out or the item to be soldered can be transported into another section of the soldering zone with a lower volume flow.

In a further advantageous embodiment of the method according to the invention the exposure of the item to be soldered to the volume flow occurs such that initially the item to be soldered is subjected to a first volume flow with a first temperature by means of a convector heater and then the item to be soldered is subjected by means of a convector heater in the soldering zone to a second volume flow with a second temperature, wherein the first volume flow is larger than the second volume flow.

This method facilitates an efficient heating of large and small components of the item to be soldered through the provision of at least two different volume flows, wherein overheating of small components during the lesser second volume flow is effectively prevented. Furthermore, through the control of the heating process by means of the volume flow there is the possibility of reacting quickly to differently designed items to be soldered, because in many conventional transit ovens equipped with convector heaters the volume flow can be rapidly adjusted, wherein a similarly quick readjustment of the temperature of the volume flow normally does not occur. For example, during an increase in the volume flow, which for example may be necessary when processing items to be soldered with a high proportion of large-volume components, the temperature of the volume flow may reduce due to the inertia in the heating from the convector heater, which however, due to the large initial volume flow, does not have a detrimental effect on the rapid heating of the item to be soldered. In a similar manner, with a reduction in the volume flow its temperature may initially increase so that with a purely temperature controlled system a corresponding time period for attaining a temperature equilibrium must be awaited, whereas according to the invention a correspondingly temporary rise in the temperature after the reduction of the volume flow can be compensated by a suitable further reduction of the volume flow so that the actual component temperature can be maintained below a specified critical temperature even directly after a corresponding system changeover. Thus, a high degree of flexibility during the processing of different items to be soldered is obtained.

In a further advantageous embodiment the soldering zone comprises a first section for the provision of the first volume flow and a second section for the provision of the second volume flow. Due to the subdivision of the soldering zone into at least one first section and at least one second section, the first and second volume flows can be adjusted respectively independently of one another, wherein there is a high degree of flexibility for any necessary change to the process sequence due to a change of the item to be soldered, as previously explained. In particular, in a system in which the first section and the second section are each supplied by separately driven heating devices, much more rapid adaptation to new items to be soldered can be achieved than is the case with the temperature controlled soldering system described in the introduction, wherein however it is ensured to a high degree that small components are not overheated, even if the temperature of the volume flow in the second section is equal to or higher than the temperature of the volume flow in the first section, because the heat transfer is just controlled effectively by the quantity of the volume flow and essentially not by the temperature difference between the item to be soldered and the volume flow.

In a further preferred embodiment the volume flow is reduced statically. That is, the volume flow and thus the temperature, which can be produced on the components of the item to be soldered, can be adjusted in that the volume flow is reduced at least part of the time without transporting the item to be soldered. For example, in an initial phase, once the item to be soldered is located in the soldering zone, it can be exposed to a relatively high volume flow, which is then reduced continuously or also in steps without transporting the item to be soldered in order not to exceed a critical temperature on smaller components.

Although with a change of the volume flow, as previously explained, its actual temperature can be changed in dependence of the type of construction and method of control of the associated convector heater, the volume flow control, which can be adjusted in a very precise manner, for example by the control of the rotational speed of an appropriate fan motor, enables a desired temperature profile on the item to be soldered to be obtained. In particular, if required, the complete soldering process can take place in a single soldering zone due to the control of the volume flow, or with the provision of a number of sections in the soldering zone a very sensitive temperature control on the components of the item to be soldered can be implemented. For example, in a first soldering section an initial high volume flow can be reduced according to a required time behaviour such that only a slight temperature change of the volume flow ensues due to the inertia of the heating element, wherein then in a second soldering section another lesser volume flow is provided which can then be controlled to a certain degree.

In a further advantageous embodiment part of the first volume flow can be branched off before entering the soldering zone in order to produce the second volume flow from the remaining proportion of the first volume flow. Through this type of closed-loop control of the first and second volume flows the actual temperatures of the volume flows are maintained essentially constant, because the load on an appropriately assigned convector heater remains essentially constant and only changes the ratio of the corresponding parts for the formation of the second volume flow.

In a further embodiment the branched off proportion of the first volume flow can be used for the preheating of another item to be soldered so that a high degree of energy exploitation can be achieved.

In a further advantageous embodiment the method comprises the selection of a maximum permissible temperature of the item to be soldered and the adjustment of the temperature of the reduced volume flow to the selected maximum permissible temperature. This measure enables the situation to be achieved in that in the phase, in which small components have already attained a relatively high temperature during the initial exposure to a high volume flow, exceeding of the maximum permissible temperature cannot occur in the further exposure to the reduced volume flow. With a static variation of the volume flow, as previously explained, at a high initial volume flow its effective temperature can be reduced due to the inertia of the assigned convection heating element, wherein however a rapid temperature increase occurs on small and, in a somewhat delayed manner, on large components. Due to the reduction of the volume flow, its effective temperature can then under some circumstances increase, wherein the fixing of the temperature of the reduced volume flow to a maximum permissible temperature ensures that this temperature is not exceeded on the components.

In a further embodiment the specified temperature, i.e. the temperature of the initial high volume flow, is also adjusted to the maximum permissible temperature. Thus, the situation is achieved in that during the complete soldering process this maximum permissible temperature is not exceeded, wherein generally a temperature profile significantly below this maximum permissible temperature is desirable. In order to maintain the thermal stress on the components at a low level, this desired temperature profile is then actually obtained from the item to be soldered by the specific volume flow reduction. Due to changing items to be soldered, the effective temperature distribution on the item to be soldered can vary, wherein however it is ensured that exactly the maximum permissible temperature is not exceeded depending on the type of item to be processed. In particular with an item to be soldered which contains very many large and therefore inert components the initial volume flow can be selected very high, for example up to the limit of the mechanical strength provided by the solder paste, so that a rapid temperature increase in this phase is achieved without the critical temperature being exceeded, even for the small components. The initially very high volume flow can then be appropriately reduced before the liquefaction of the solder paste so that the fixing of the components on the solder paste remains secure during the soldering process.

In a further embodiment the specified temperature is maintained below a critical temperature for certain components and the temperature of the volume flow is increased after its reduction. In this way, in the initial phase with the high volume flow, in which a rapid temperature rise is to occur particularly on the large components, it is ensured that a critical temperature for certain components, for example small semiconductor components, is under no circumstances exceeded. In the following phase with the reduced volume flow the temperature can then even be increased, wherein the slight volume flow prevents overheating of the small components in an efficient manner. As previously explained, a corresponding temperature rise can be caused, at least intermittently, by a corresponding inertia of a convection heating element, which can then however be advantageously exploited for the further temperature profiling of the item to be soldered, and can however be maintained in a range uncritical for small components through the closed-loop control of the volume flow.

According to a further aspect of the invention, a method of soldering an item to be soldered in a transit oven comprises the following steps. First, the item to be soldered is heated to a temperature below the melting point of a solder. Then the item to be soldered is exposed to a first temperature lying above the melting temperature by means of a volume flow. Then the item to be soldered is exposed to a second temperature lying above the melting temperature and which is lower than the first temperature, wherein the volume flow is changed.

According to the invention the temperature profile on an item to be soldered, which occurs due to the exposure to a first high temperature and a second lower temperature in the soldering phase, such as described for example in the introductory part, can be significantly improved in that the temperature profile is maintained more precisely and flexibly by means of a suitable change in the volume flow which is used on the item to be soldered. Thus, for example a correspondingly high difference between the volume flow and the item to be soldered can be achieved with the aid of a moderate volume flow at a relatively high input temperature, wherein rapid heating of both small and also large components occurs. Through an appropriate temporal dimensioning of the exposure to the first temperature, excessive heating of the rapidly heated small components can be prevented in that the item to be soldered is now exposed to a second lower temperature, which still however lies above the melting temperature, wherein the volume flow can significantly improve a corresponding temperature profile on the item to be soldered, because in particular the thermal transfer out of the volume flow onto the item to be soldered can depend on the flow characteristics in the immediate vicinity of the item to be soldered. For example, it is possible in one variant during the first, i.e. high temperature, to produce a relatively low volume flow, because for example a relatively laminar flow can occur in regions which essentially comprise only small components. The laminar flow leads to a more inefficient thermal transfer than a corresponding turbulent flow which is produced by large volume components. As a result, the thermal transfer on large volume components can be overproportionally higher in comparison to small components if they are arranged in the regions of the item to be soldered which are little affected by the turbulence. During the following exposure to the lower second temperature, the volume flow can then be increased appropriately so that overall the thermal transfer onto the item to be soldered increases significantly so that then the large volume components continue to heat up rapidly whereas the temperature of the small components can as a maximum increase to the second temperature and thus an impermissible overheating of these small components is excluded. Furthermore, through the improved thermal transfer in the increased second volume flow a small component, which in some circumstances may have suffered rapid heating during the initial phase, can be "cooled down" to the second temperature in a very efficient manner and thus brought into a range uncritical for the component.

In other situations it may be advantageous to support the heating of the item to be soldered in the initial phase by means of a high volume flow, wherein in the following soldering phase with the second lower temperature a reduced volume flow is provided, which for example ensures mechanical fixing of the small components, wherein however, due to the stronger turbulent flow on large volume components, further heating of these components is facilitated.

According to a further aspect of the invention a device for soldering an item to be soldered is provided, wherein the device comprises a preheating zone, a soldering zone, which can be exposed to an adjustable volume flow of hot gas of an adjustable temperature by means of a convector heater, and a cooling zone. Furthermore, the device according to the invention comprises a control unit, which is at least functionally connected to the convector heater and is formed so as to cause the volume flow with a specified magnitude and temperature to act on an item to be soldered in the soldering zone and then to cause the volume flow with lower magnitude and the same or higher temperature to act on the item to be soldered.

An appropriate device is thus formed for implementing the method according to the invention for the temperature profile by means of volume flow reduction in an efficient manner.

In a further advantageous embodiment a controllable gas guidance system is provided in the convector heater in order to expose in a controlled manner at least the preheating zone and the soldering zone with hot gas of a defined temperature and a defined volume flow. The provision of an appropriate gas guidance system facilitates a more efficient exploitation of the energy required to operate the device, because in particular the thermal energy provided by the convector heater can be exploited in a more efficient manner, in that for example part of the hot gas which is no longer needed during a possible volume flow reduction in one zone can be used for the generation of an appropriate volume flow in another zone.

BRIEF DESCRIPTION OF THE DRAWINGS

Further illustrated embodiments will now be described in more detail with reference to the accompanying drawings. In the drawings the following are shown:

FIG. 2b shows an example of the temperature trace of a small component and a large component when they are processed with the device from FIG. 2a.

DETAILED DESCRIPTION

Figure 1A:
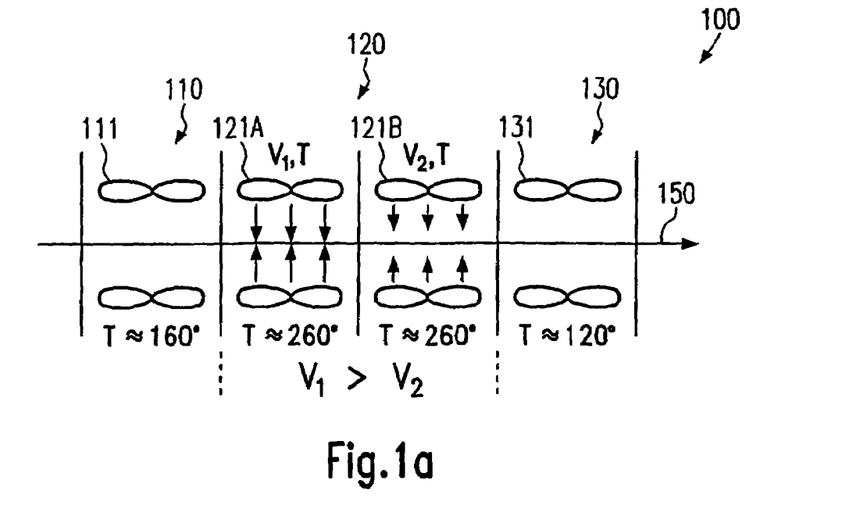
FIG. 1a schematically shows a transit oven, which is operated according to the invention such that a volume flow in a first phase is higher than in a second phase, wherein the temperature for both volume flows remains approximately the same.

FIG. 1a shows schematically an example of a device for reflow soldering in the form of a transit oven 100, which in the illustrated example comprises at least a preheating zone 110, a soldering zone 120 and a cooling zone 130. Furthermore, a transport device 150 is provided which conveys an item to be soldered (not shown), for example in the form of an electronic circuit board that can be provided with various components fitted by means of a solder paste, through the individual zones 110, 120 and 130. In the illustrated example the soldering zone 120 is subdivided into two sections 120a and 120b, wherein in the section 120a a certain volume flow of hot gases with a specified temperature T is directed onto the transport unit 150 and optionally onto an item to be soldered located on it by means of a first convector heater 121a. In a similar manner, the soldering section 120b comprises a convection heater unit 121b, which directs a predefined volume flow of hot gases with a specified temperature T onto the transport device 150 or onto an item to be soldered located on it. In the illustrated embodiment the convection heating elements 121a, 121b are formed to expose the item to be soldered to an appropriate volume flow with the specified temperature from both sides. In other embodiments the convection heater elements 121a, 121b can be formed to expose only one side of the item to be soldered with a volume flow at a specified temperature. Furthermore, it is possible to provide a large number of soldering sections 120a, 120b in the soldering zone 120, wherein they are then equipped with appropriate convection heating elements 121a, 121b such that a temperature profile acting on the transport device 150 of an item to be soldered located on it can be adjusted in a desired manner. Furthermore, the preheating zone 110 comprises an appropriate convector heater 111 and optionally the cooling zone 130 similarly comprises an appropriate convector heater 131. In other embodiments the preheating zone 110 and/or the cooling zone 130 can comprise one or more sections each with separate convector heaters. Furthermore the convector heaters 121a, 121b and optionally the heater devices 111 and 131 can comprise separate heater elements in order to suitably heat an appropriate process gas, for example air to then provide a predefined volume flow at a certain temperature in the individual zones using appropriate fan elements. In other embodiments, such as will be described later for example with reference to FIG. 3, the heater devices can comprise a central heating element and an appropriately implemented gas guidance system to provide the volume flows with the required magnitude and temperature in the individual zones. In particular the individual zones 110, 130 and the sections 120a, 120b can be realised in identical manners, wherein their function is given by the selection of the magnitude of the volume flow and its temperature.

During the operation of the device 100 an item to be soldered, which generally comprises components of different size, is brought into the preheating zone 110 by means of the transport device 150 and is there relatively slowly heated to a temperature of for example 160° C. such that an essentially uniform temperature distribution prevails on the item to be soldered, i.e. such that the small components and the large components essentially exhibit the same temperature. As explained in the introduction, this slow and therefore relatively uniform heating process cannot be carried out up to the melting temperature of the solder paste, because activators in the solder paste develop their effect prematurely and are consumed and in addition oxidation of the solder contacts arises. Thereafter, the item to be soldered is transported by means of the transport device 150 into the soldering zone 120, i.e. in the illustrated embodiment in the first section 120a, wherein the total dwell period in the soldering zone 120 should remain significantly shorter than 60 seconds in order to produce fault-free solder joints. In the illustrated embodiment the heater device 121a is set such that a volume flow V1 of predefined magnitude and with a specified temperature, for example 260° C., acts on the item to be soldered. The magnitude of the volume flow V1 is here selected such that a high temperature prevails in the vicinity of the item to be soldered, so that a rapid heating of the item to be soldered to above the melting temperature of the solder paste is achieved. Due to the relatively high temperature and the high volume flow a very rapid rise in temperature takes place on the small components, whereas the larger components increase in temperature at a somewhat slower speed. After a specified dwell period, which in typical process runs may be between 5 and 40 seconds, the item to be soldered is transported into the second section 120b in which a significantly lesser volume flow V2 at about the same temperature, e.g. 260° C., leads to a lower effective temperature on the item to be soldered and therefore prevents overheating of the smaller components, whereas the larger components continue to heat up as before and so reliably exceed the melting temperature of the solder paste. After a specified time period, for example in the range of 15 to 35 seconds, the item to be soldered is transported into the cooling zone 130, in which it loses temperature by forced convection or simply through natural convection. Through the reduction of the volume flow V1 to the value V2 at a relatively constant temperature, overheating of small components can be prevented in an efficient manner, whereas larger components are reliably soldered at least in the region 120b. The previously quoted times and temperature values are only examples and can be chosen appropriately differently to suit a desired process sequence. For example, it may be advantageous with critical components to select a maximum permissible temperature in advance and to at least adjust the temperature in the section 120b to this maximum permissible temperature so that this temperature cannot in any circumstances be exceeded during the longer soldering phase for the large components. In other embodiments it may be advantageous to maintain this maximum permissible temperature in the first section 120a, wherein then a corresponding rapid heating of the complete item to be soldered is achieved through an appropriate increase in the volume flow V1. For example, a maximum permissible temperature of 220° C. may be defined for a special component, wherein then a correspondingly higher volume flow V1 is produced to achieve rapid exceeding of the melting temperature of the solder paste despite the relatively low temperature. Since also in this case the solder paste first liquefies on small components due to the faster temperature increase, a correspondingly high volume flow may cause undesired flowing of the solder paste so that a corresponding reduction of the volume flow V1 can be implemented to a lower value before the solder paste liquefies on smaller components. This time point can be acquired experimentally by means of one or more test runs or can be found by measurement means.

Figure 4:
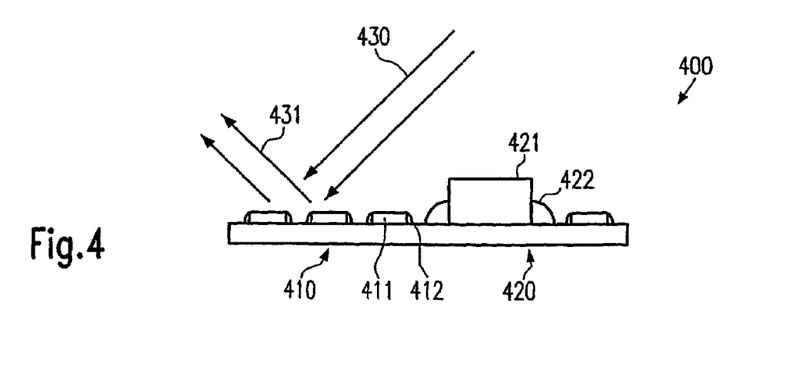
FIG. 4 schematically shows a method for the control of the change of a volume flow in dependence of the optical characteristics of a certain region of an item to be soldered.

FIG. 4 shows an example of an item 400 to be soldered in the form of an electronic circuit board which comprises a first region 410 and a second region 420. In the first region 410 a number of small components 411 are arranged which are attached to the base circuit board by means of a solder paste 412. In the second region 420 a large component 421 is positioned by means of appropriate solder paste regions 422. During the exposure of the item 400 to be soldered to a high volume flow V1 at relatively low temperature the components 411 and 421 are rapidly heated due to the large thermal transfer achieved by the high volume flow V1, wherein however the small components 411 quickly gain in temperature and thus the melting temperature for the solder paste 412 is reached more rapidly. With the onset of liquefaction one feature that changes is the optical characteristics of the solder paste 412; for example it can become substantially more reflecting than in the solid state so that therefore the reflective properties of a light beam 430 incident on the first region 410 also change and this change in the reflected beam 431 can be detected. Once the reflected light beam 431 indicates a corresponding change of the properties of the solder paste 412 in the region 410, the volume flow V1 in the region 120a can then be reduced to a value which does not essentially mechanically affect the liquid solder paste 412. Since the magnitude of the volume flow can be controlled in very short time ranges, for example within a few milliseconds, for example, by the rotational speed of a suitable fan element, the volume flow V1 itself can be reduced on a rapid transition to the melted state in the region 410 in order to obtain adequate fixing of the components. Furthermore, due to the relatively low temperature of the volume flow, exceeding of the permissible temperature is efficiently prevented. The further soldering process can then be implemented as previously described.

Figure 1B:
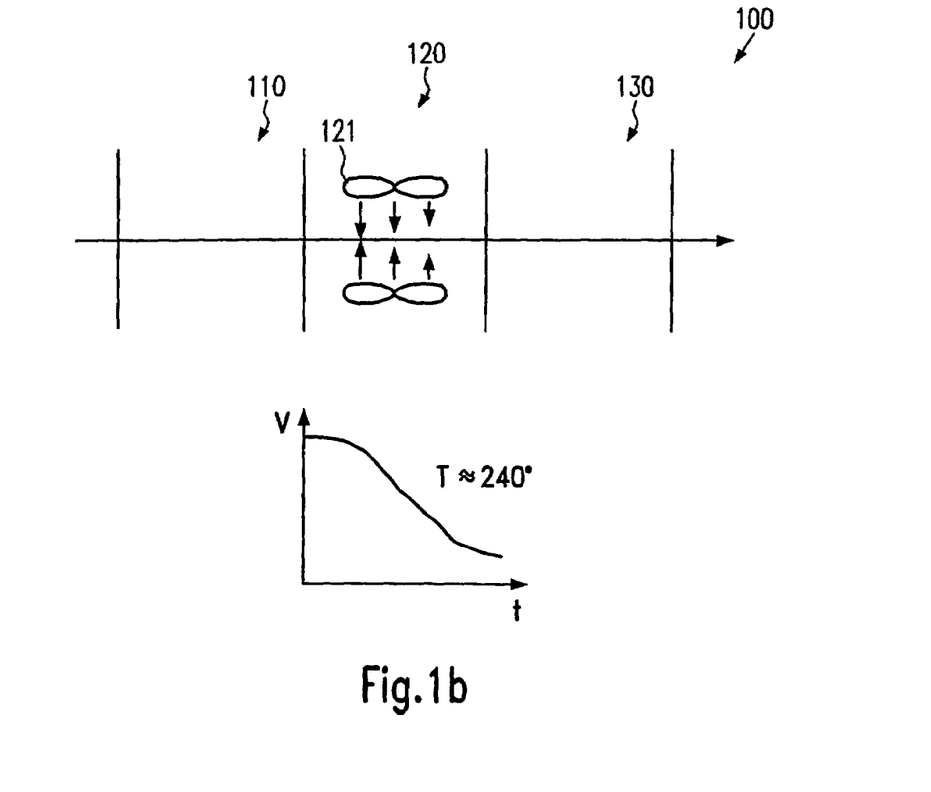
FIG. 1b shows a transit oven, in which a volume flow is continuously reduced at relatively constant temperature from an initially high value, wherein the change in the volume flow can occur for example in a static manner, i.e. without transport of the item to be soldered.

FIG. 1b shows schematically another alternative embodiment in which the volume flow is changed relatively continuously, for example based on a detection signal which is obtained with the method previously described in FIG. 4, wherein then the complete soldering process can take place for example in a single soldering zone. In FIG. 1b therefore the device 100 comprises a single soldering zone 120 with a heating device 121 coupled to it, wherein the volume flow is controlled such that a desired temperature profile is obtained on the item to be processed. For example, with the introduction of the item to be soldered into the soldering zone 120 a relatively high temperature with a high volume flow can be produced, wherein then the volume flow is continuously or incrementally reduced, for example at constant temperature so that larger components are heated as before, whereas the smaller components do not essentially increase in temperature.

The control of the effective temperature on the item to be soldered, i.e. here this means the temperature produced in/on the item to be soldered, by means of the volume flow thus facilitates very sensitive temperature profiling on the item to be soldered within a single chamber, because the rotational speed of an electric motor and therefore the volume flow can be adjusted in a very sensitive and rapid manner. Furthermore, in this manner the temperature produced in/on the item to be soldered by means of the closed-loop control of the volume flow can be coupled in an effective manner to a detection signal which could not be realised with pure temperature controlled profiling of the soldering process due to the inertia during a temperature change. The graph in FIG. 1b shows a typical trace of the volume flow V in dependence of the time for, for example, a volume flow temperature of 240° C. in order to achieve a soldering process in 40 to 60 seconds in the single soldering zone 120.

Due to the closed-loop volume flow control according to the invention it is not only possible to increase the throughput of a transit oven in that just one soldering zone can be provided, but rather a change of the process sequence can also occur in a rapid manner, i.e. a change of the process temperatures and of the volume flows, because the effective thermal transfer is essentially obtained by the control of the volume flow and only secondarily by the actual process temperature of the gas. For example, the soldering of an item to be soldered with significantly more large volume components compared to a previously processed item to be soldered can necessitate a general increase in the process temperature, wherein the exact maintenance of a certain temperature is not very critical, because the corresponding thermal transfer to the item to be soldered can essentially be controlled by the volume flow and therefore can be matched in a rapid and flexible manner to the new situation. For example, the increase in the process temperature for the new item to be soldered can lead to a shorter process time, wherein however in the heating up phase to the new process temperature an appropriate control of the volume flow, for example controlled by a detection signal, also leads to correct soldering results in this transitional phase.

In the previously described embodiments the process temperature is assumed to be relatively constant during a change of the volume flow. In some transit ovens the heating devices, for instance the heating devices 121a, 121b, are provided as separately controllable convector heaters, so that a change of the volume flow, for example a reduction of the volume flow, can lead to a temperature change, for example a temperature rise, because in this case less heat is taken from the heater element and thus more heating of the process gas can occur on the heater element. This means that in some embodiments the temperature of the reduced volume flow can be higher than the temperature with a high volume flow, which however does not have any negative effects on the soldering process, because the volume flow can be reduced such that the effective temperature on the small components remains below a critical range. In other cases this higher temperature can even be exploited advantageously in that the volume flow is reduced such that the smaller components are subjected to an essentially laminar flow, wherein the thermal transfer is substantially restricted, and wherein the larger components cause turbulence on their surfaces, which furthermore in comparison to the smaller components facilitates a higher thermal transfer and thus overproportional heating, which, in combination with the generally increased process temperature of the volume flow, heats in particular the larger components more efficiently.

Figure 2A:
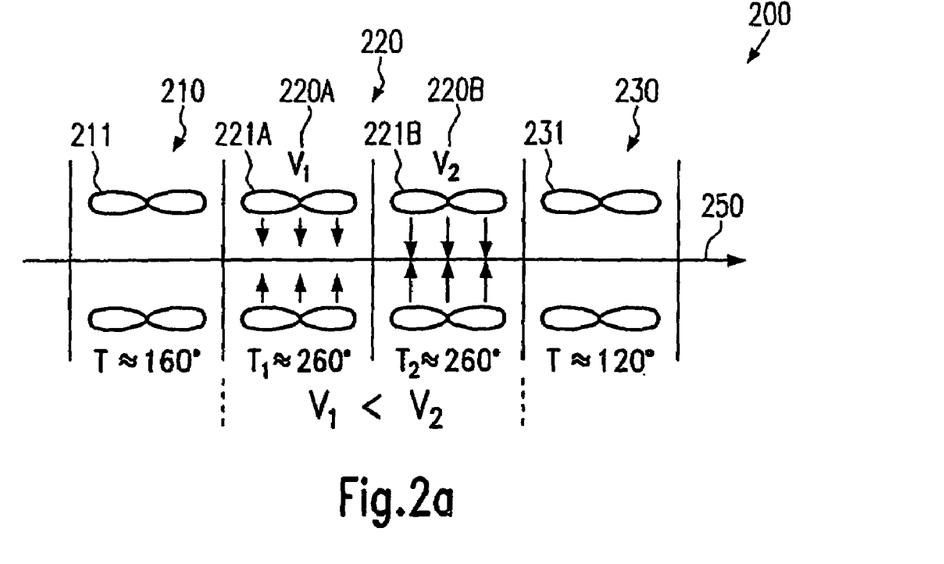
FIG. 2a shows a transit oven, in which a high first temperature is maintained in a first soldering section and a lower second temperature in a second soldering section, wherein according to the invention the volume flow is changed and in the illustrated example is adjusted higher than the volume flow with the higher temperature.

FIG. 2a schematically shows a transit oven 200 with a preheating zone 210, a soldering zone 220, which comprises a first section 220a and a second section 220b, and with a cooling zone 230. The single zones 210, 220 and 230 comprise corresponding convector heaters 211, 221a, 221b and 231, which can be constructed in a manner similar to that described with reference to FIG. 1a.

During the operation of the transit oven 200, the heating devices 221a and 221b are in particular adjusted such that the process temperature, i.e. the temperature of the process gas, is adjusted to a relatively high value, for example 280° C. and appropriate to a first moderate volume flow V1 is directed onto a corresponding item to be soldered, whereas the process temperature in the section 220b is significantly lower, but however still lies above the melting temperature of the solder paste, for example at 210° C. Here, however the volume flow V2 with the temperature 210° C. is significantly increased in comparison to the volume flow V1 in the section 220a. On introducing an item to be soldered in the section 220a, a rapid heating of small and large components is realised due to the high process temperature, wherein the dwell period in the section 220a is dimensioned to be so short that no overheating of the smaller components occurs, which heat up more quickly than the larger components. The item to be soldered is then transported into the second section 220b where it is exposed to the lower temperature T2, wherein however the volume flow V2 is significantly increased so that due to the increased volume flow efficient heating of the larger components furthermore follows, whereas the smaller components are maintained at the temperature T2 or are rapidly adjusted to it.

Figure 2B:
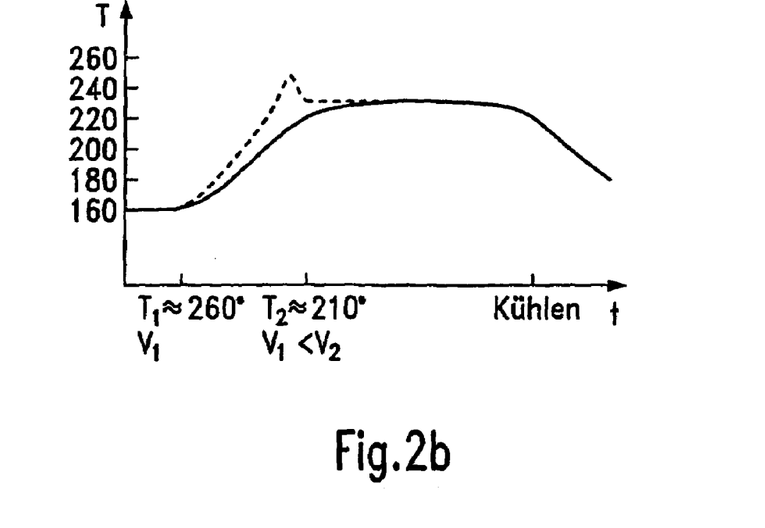

FIG. 2b shows an example of a temperature profile for a small component, which is represented by the dashed line, and a larger component, which is represented by the continuous line. After introduction into the section 220a with the process temperature of, for example, 280° C. and a moderate volume flow V1 a rapid heating of the small component takes place to a temperature of about 230° C., whereas the large component exhibits a final temperature of about 200° C. in the section 220a. After introducing the item to be soldered into the section 220b, the temperature of the small component falls away quickly due to the "cooling effect" of the higher volume flow at the lower temperature and then remains constant at this uncritical temperature. In contrast the temperature of the large component however quickly increases despite the lower process temperature, because the high volume flow V2 facilitates an efficient thermal transfer to the component. Due to the change of the volume flow at the specified temperatures, in contrast to the method described in the introduction, a shorter process time and/or a higher reliability can be achieved, because the increase in volume flow at the low temperature reliably cools small components to an uncritical temperature which can therefore be selected very high.

In other embodiments it can be advantageous to select the volume flow correspondingly high at a high initial temperature to facilitate very fast heating and to then apply a significantly lower process temperature, wherein then also a reduced volume flow is adjusted to effectively reduce the thermal transfer for small components and simultaneously to continue to efficiently heat the larger components which can cause a turbulent flow.

Figure 3:
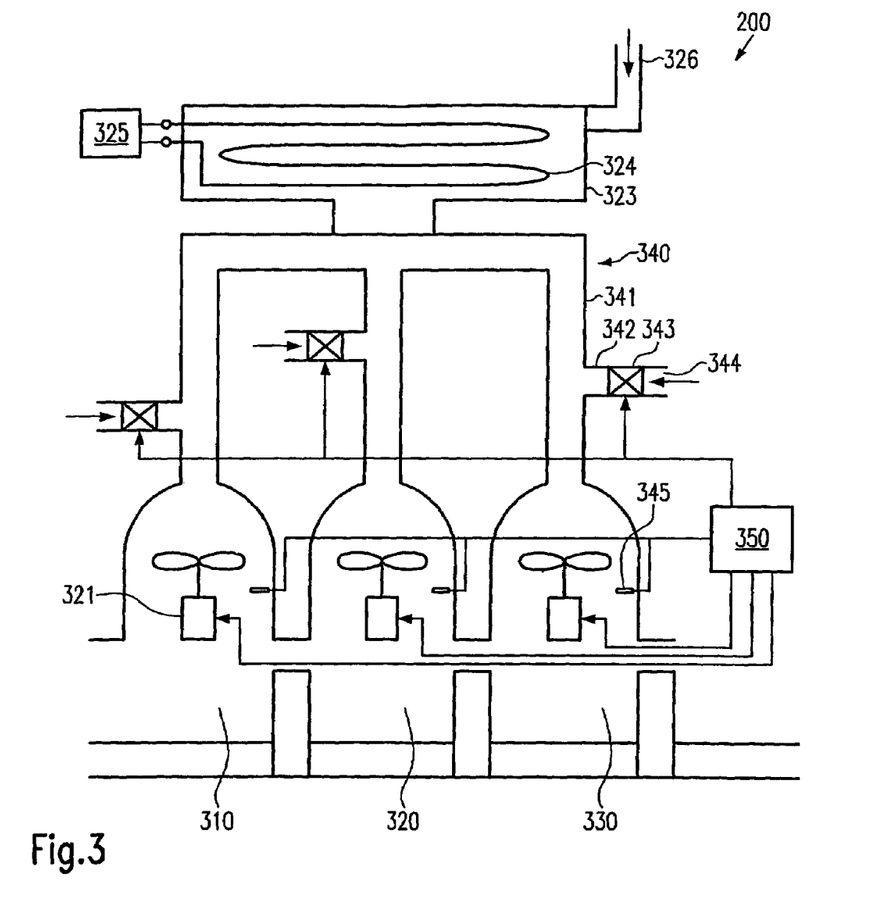
FIG. 3 shows a device according to the invention, which comprises a controllable gas guidance system, in order to produce in an efficient and controllable manner volume flows with specific temperature for many zones of a transit oven.

FIG. 3 schematically shows a further embodiment of a device for reflow soldering, which is represented in the form of a transit oven 300, wherein it also comprises a control unit 350 to thus control the volume flow and the process temperature in particular in the manner described with reference to FIGS. 1a and 1b. Furthermore, the device 300 comprises a heating device 323 with the heater loops 324 fitted in it, which is for example electrically powered by means of a suitable power supply 325. Furthermore, a connection 326 for feeding a process gas, for example air, nitrogen or a similar gas, is provided. The heating device 323 is connected to a gas guidance system 340, which in turn is coupled to one or more electrically powered fan devices 321. The gas guidance system 340 comprises one or more hot gas lines 341, which are coupled to the heating device 323, and appropriately comprises many process gas feeder lines 342, which are connected by means of a controllable valve element 343 to a source of cooler process gas 344. Furthermore, temperature sensors 345 are provided and fitted so as to acquire the temperature of a volume flow which is fed into an appropriate zone of the device 300. The electrically driven fan devices 321, the controllable valve elements 343 and the temperature sensors 345 are connected to the control device 350.

During the operation of the device 300 sufficient energy is fed to the heater elements 324 by means of the power supply 325 to heat a process gas, fed via the line 326, in sufficient quantity to a high temperature, for example 300° C. or more. An appropriate volume flow depending on a desired operational recipe is produced in the respective zones of the device 300 by the control unit 350 by means of adjusting a desired rotational speed, wherein the temperature of the corresponding volume flow is measured by means of the temperature sensors 345 and the controllable valve elements 343 are set according to the measurement results in order to obtain, by a suitable valve setting, a mixture of the hot process gas from the heater element 323 and the cooler process gas, which is fed through the line 344, with the desired temperature. In this manner the process temperature can in an efficient manner be maintained constant for varying volume flow or can be rapidly changed according to the process requirements. For example, the individual zones 310, 320, 330 can each correspond to a soldering zone in which simultaneously three items to be soldered are processed, wherein in each of the zones the volume flow and the process temperature can be adjusted in the manner previously described according to the desired process recipe or according to the detection signals obtained from the item to be soldered. In other embodiments the zones 310, 320 and 330 can correspond to a preheating zone, a soldering zone and a cooling zone, wherein an item to be soldered is transported consecutively into these zones and appropriate volume flows and temperatures are adjusted in the zones. In particular with different volume flows, for example in the soldering zone 320, the proportion of process gas no longer needed during a transition from a high volume flow to a low volume flow can be used in an efficient manner in other zones. On the other hand, with a currently high requirement in the soldering zone 320 the volume flow in the zone 310 and/or 330 can be reduced, for example at the same remaining temperature, so that the heater device 323 only needs to be rated for continuous operation, i.e. for example the soldering phase at reduced volume flow, and does not need to be continuously rated for energy corresponding to a peak load for a briefly increased volume flow. In other embodiments the control unit 350 can additionally be connected to an appropriate detection system, for example an optical detection system, which can detect a change of optical properties of certain regions of the item to be soldered in order to thus control the soldering process based on the detection signals obtained. The provision of the control unit 350 in interaction with the principle according to the invention of the change of the volume flow for the control of the temperature profile on an item to be soldered produces, optionally in combination with an appropriate detection device, an extremely flexible device for reflow soldering, in which not only a high degree of reliability of the soldering process is ensured due to the very uniform heating of large and small components, but rather also a rapid adaptation to modified process strategies, for example, due to a change of the item to be soldered is facilitated.

The invention claimed is:

1. A method of soldering an item to be soldered in a transit oven comprising:
    heating the item to be soldered in a preheating zone using a preheating device to a first temperature below the melting temperature of a solder in contact with the item to be soldered;
    subjecting the item to be soldered in a soldering zone with a first volume flow of a fluid with a second temperature higher than a melting temperature of the solder generated by a convection heater;
    after subjecting the item to be soldered with the first volume flow, subjecting the item to be soldered in the soldering zone with a second volume flow of a fluid with the second temperature, and
    cooling the item to be soldered below the melting temperature,
    wherein the first volume flow is larger than the second volume flow, and
    wherein the convection heater heats the item to be soldered from both sides with the first and second volume flows at the second temperature.

2. The method according to claim 1, wherein the soldering zone comprises a first section for providing the first volume flow and a second section for providing the second volume flow.

3. The method according to claim 1, wherein at least one of the first and second volume flows is statically reduced.

4. The method according to claim 2, wherein part of the first volume flow is branched off before entering the soldering zone in order to produce the second volume flow from the remaining portion of the first volume flow.

5. The method according to claim 4, wherein the branched off part of the first volume flow is used for preheating a further item to be soldered.

6. The method according to claim 1, further comprising:
    setting a maximum temperature of the item to be soldered; and
    adjusting the second temperature of the second volume flow to substantially the set maximum temperature.

7. The method according to claim 6, wherein the second temperature is set to the maximum temperature.

8. The method according to claim 2, wherein at least a first convection heating unit of the convection heater is provided in a first soldering zone and at least a second convection heating unit of the convection heater is provided in a second soldering zone.

9. The method according to claim 1, wherein the first volume flow is reduced based on a measurement of the item to be soldered.

* * * * *